United States Patent
Candy

(10) Patent No.: US 7,301,393 B2
(45) Date of Patent: Nov. 27, 2007

(54) LOW DISTORTION CLASS-D AMPLIFIER USING CARRIER REFERENCE SIGNAL SYMMETRY MODULATION

(75) Inventor: Bruce Halcro Candy, Basket Range (AU)

(73) Assignee: BHC Consulting Pty., Ltd., Basket Range (AU)

( * ) Notice: Subject to any disclaimer, the term of this patent is extended or adjusted under 35 U.S.C. 154(b) by 56 days.

(21) Appl. No.: 10/545,151

(22) PCT Filed: Feb. 11, 2004

(86) PCT No.: PCT/AU2004/000149

§ 371 (c)(1),
(2), (4) Date: Apr. 14, 2006

(87) PCT Pub. No.: WO2004/073161

PCT Pub. Date: Aug. 26, 2004

(65) Prior Publication Data

US 2007/0052478 A1    Mar. 8, 2007

(30) Foreign Application Priority Data

Feb. 11, 2003 (AU) .............................. 2003900602
May 27, 2003 (AU) .............................. 2003902606

(51) Int. Cl.
*H03F 3/38* (2006.01)
(52) U.S. Cl. ............... 330/10; 330/251; 330/207 A
(58) Field of Classification Search ............ 330/10, 330/251, 207 A
See application file for complete search history.

(56) References Cited

U.S. PATENT DOCUMENTS

| 4,146,828 | A | * | 3/1979 | Ross et al. ................ 318/599 |
| 5,077,539 | A | * | 12/1991 | Howatt ....................... 330/10 |
| 5,617,058 | A | * | 4/1997 | Adrian et al. ................ 330/10 |
| 6,127,885 | A | * | 10/2000 | Colangelo .................... 330/10 |
| 6,552,606 | B1 | * | 4/2003 | Veltman et al. ............... 330/10 |
| 7,010,280 | B1 | * | 3/2006 | Wilson ....................... 455/126 |
| 2002/0075069 | A1 | | 6/2002 | Karki et al. |
| 2003/0030486 | A1 | | 2/2003 | Noro et al. |

FOREIGN PATENT DOCUMENTS

WO   WO 00/59109        10/2000
WO   WO 03/067753 A1    8/2003

* cited by examiner

*Primary Examiner*—Patricia Nguyen
(74) *Attorney, Agent, or Firm*—Osha Liang LLP

(57) ABSTRACT

An electronic class-D amplifier with intrinsically low distortion employing modulation of the slopes of a triangular-wave carrier reference signal; the modulation being in proportion to the derivative of the input signal. The negation of the distortion is most successful if this derivative signal is shifted in phase and gain to compensate for the closed loop phase and gain of the amplifier. The amplifier includes a pulse width modulator which includes an oscillator (5) with at least one integrator and a first comparator (6), at least one servo-loop amplifier (3), an input signal processor (4) which processes and modifies the input amplifier signal. An output signal of the oscillator produces a carrier reference signal (13) which includes at least positive and negati derivative components, which are modulated by an output of the input signal processor (4) which is applied to a modulation input of the oscillator (5), whereby at least the symmetry of the carrier reference signal is modulated. An output (11) of the output switching stage is fed back via a negative feedback path (15) to an input of the servo-loop amplifier (3).

8 Claims, 5 Drawing Sheets

LOW DISTORTION CLASS-D AMPLIFIER USING CARRIER REFERENCE SIGNAL SYMMETRY MODULATION

TECHNICAL FIELD

This invention relates to a class-D switching amplifier and has particular application to class-D analogue power amplifiers, particularly audio frequency amplifiers.

BACKGROUND ART

The following descriptions are provided to help the reader understand how the current inventor has proceeded to analyse circuits of which he is aware and to assist the reader in understanding the relevance of the circuit invention. However, these references are neither Intended to, nor do of themselves, provide any admission by the applicant that they are published as may be required for an assessment of novelty or obviousness or are common general knowledge according to the laws of and in any particular country in the world.

Several models of commercial switching amplifiers are known, including class-D amplifiers. Most utilise a system including a first order servo-loop amplifier whose output is connected to a modulation input of a pulse width modulator. An output of the pulse width modulator is connected to an input of an output switching stage. A negative feedback path connects an output of the output switching stage to an input of the servo-loop amplifier and an amplifier input is also connected to an input of the servo-loop amplifier. This system may be viewed conceptually as the output of the servo-loop amplifier, being an integral of an error signal, the error signal being proportional to the difference between the scaled output signal of the output switching stage and amplifier input signals. This integrated error signal is that which is fed to the said modulation input.

The pulse width modulator in some systems includes a triangular-wave oscillator, whose output signal acts as a carrier reference signal which is applied to an input of a comparator. In some systems that are less common, the carrier reference signal is a sawtooth waveform rather than a triangular waveform. An output of the servo-loop amplifier Is also applied to an input of the comparator: The comparator and the triangular wave oscillator act as the said pulse-width modulator, wherein an output of the comparator acts as the output of the pulse width modulator.

The servo-loop amplifier most often has a forward transfer function of which is a current-to-voltage integrator.

This system uses negative feedback to reduce distortion, that is, improve accuracy. However, this system is known to produce distortion intrinsically. That is, the system produces distortion even for near-perfect electronic components or, in other words, mathematically for idealised components.

In addition, electronic imperfections which are significant, for example in practical power output switching stages, produce further errors.

Details of a system utilising these basic functions just described is given in Motorola application note AN1042.

A simpler class-D amplifier, with no negative feedback or servo-loop amplifier and direct input signal modulation of the pulse width modulator, is utilised by a Zetex integrated circuit ZXCD1000. Assuming all components are ideal in such a system concept, this idealised system is known to produce no distortion in contrast to the servo-loop system described above. However, this direct modulation system in practice is known to have several problems compared to the servo-loop approach, namely:

The output noise is typically higher owing to no feedback.

The distortion resulting from the imperfections of less than ideal, practical, electronic components is greater at low frequencies, where negative feedback of the servo-loop system is of assistance.

The output signal of the direct modulation system is proportional to the output stage supply rails and is thus modulated by variations in these rails. Owing to negative feedback, this effect is reduced in the servo-loop system, particularly at lower frequencies for which there is more negative feedback.

Class-D amplifiers have been developed by Bang and Olufsen which that company calls its "ICEpower" products. The principles of this system are described in numerous Audio Engineering Society publications and patent U.S. Pat. No. 6,297,692. This discloses an analogue switching amplifier in which the overall amplifier dominant pole is set by elements both in the forward servo-loop amplifier paths and also in the negative feedback paths.

Some Bang and Olufsen ICEpower models 250A, 500A, 250ASP and 500ASP, that I was able to try illustrated, for me at least, the following performance results: For example, the distortion at 20 kHz at higher powers but below clipping, into 4 ohms did appear to me to be close to 1% (100 kHz measurement bandwidth). If the results were accurate, this is roughly 2 orders of magnitude worse than typical well designed traditional analogue amplifiers. From my general knowledge of this field, I suspect that the ICEpower units perform relatively well compared to some other brands of class-D amplifier products.

While I have referred to a specific class-D amplifier that is commercially available I am aware that units do vary and as such results should of themselves not be necessarily taken as confirmation, but they do suggest that there is some difficulty with such amplifiers.

A circuit utilising the ICEpower basic principles is published in "Radio Technique" December 2002, pages 58-64.

The same publication at pages 140-144 also discloses a common servo-loop system but instead of the servo-loop amplifier being a first order integrator, it is designed as a second order servo-loop system. This offers more feedback at low frequencies. Paradoxically, at higher frequencies, where little additional negative feedback is available relative to the first order system, the distortion is intrinsically worse owing to the shape of the signal at the output of the servo-loop amplifier.

An object of this invention is therefore to provide an amplifier improvement that assists in reducing distortion or at least provides the public with a useful alternative.

DISCLOSURE OF THE INVENTION

In one form of this invention, there is provided an electronic class-D amplifier having an amplifier input to which an amplifier input signal may be applied, an amplifier output which may produce an amplifier output signal, an output switching stage, a pulse width modulator which includes an oscillator and a first comparator, at least one servo-loop amplifier, an input signal processor which processes and modifies the amplifier input signal, wherein an output of the oscillator produces a carrier reference signal which includes at least positive and negative time derivative components, which are modulated by an output signal of the input signal processor which is applied to a modulation input of the oscillator, whereby at least the symmetry of the carrier reference signal is modulated, the oscillator includes at least one integrating element, the amplifier input being connected to an input of the servo-loop amplifier, the servo-loop amplifier also including at least one integrating element, the amplifier input also being connected to an input of the input signal processor, an output of the servo-loop amplifier being connected to a modulation input of the pulse width modulator, an output of the pulse width modulator being connected to an input of the output switching stage, and an output of the output switching stage being connected to the amplifier output, wherein a negative feedback path connects an output of the output switching stage to an input of the servo-loop amplifier.

In preference, the invention is further characterised in that a forward transfer function of the integrating element of the oscillator is at least second order, and the forward transfer function of the integrating element of the servo-loop amplifier is of at least second order.

In preference, the invention is further characterised in that the input signal processor includes a forward transfer function which includes at least a derivative with respect to time.

In preference, the invention is further characterised through including power supply rails which supply the output switching stage adapted such that peaks of the carrier reference signal track a difference in potential between power supply rails which supply the output switching stage.

In preference, the invention is further characterised in that an output of the servo-loop amplifier is connected to an input of the said first comparator, the carrier reference output signal of the oscillator is fed to an input of the comparator, and an output of the comparator is an output of the pulse width modulator.

In preference, the invention is further characterised in that the forward gain of the output switching stage, the forward gain of the servo-loop amplifier, and modulation forward gain of the oscillator and input signal processor, and the mean frequency of the carrier reference output signal, and the gain of the negative feedback path, are selected to lower the distortion of a signal at the amplifier output relative to a signal applied to the amplifier input.

In preference, the Invention is further characterised in that the oscillator includes a wide-band amplifier with a unity-gain-bandwidth greater than at least 100 MHZ.

In preference the invention is further characterised in that the mean frequency of the output carrier reference signal, and the peak signal from the output of the output switching stage and potential currents flowing within this stage, are consistent with class-D power audio amplification.

In a further form this invention can be said to reside in a method of amplification which includes the steps of introducing a signal to be amplified into an amplifier as characterised above.

BRIEF DESCRIPTION OF DRAWINGS

For a better understanding, further description will now be given, with reference to drawings in which.

BEST MODE FOR CARRYING OUT THE INVENTION

It is my experience that many texts in this field merely present solutions, sometimes with relatively esoteric mathematics which is often intractable. It is further my experience that some researchers purporting to be skilled in the art of class-D amplifiers do not seem to hold a useful mechanistic model in their minds of how distortion is produced. To aid the reader in comprehending the mechanisms causing distortion in prior art class-D amplifiers, and the effects of solutions disclosed in this invention, a mechanistic model is presented in which the operations may be more easily understood.

Hence, some of the below description is merely an aid to understanding via a useful mechanistic model, and should not be taken in the same sense as a rigorous scientific explanation.

For common prior art class-D amplifier system gains and frequencies, the class-D amplifier may be thought of as approximating a non-linear non-switching analogue amplifier, containing to a first order approximation:

A servo-loop amplifier wired up in the same way as class-D servo-loops, namely as an integrator which integrates an error signal equal to the difference between the output and input signal;

an output buffer stage acting as an analogue to the output switching stage of the class-D amplifier, but including a variable time period advance element between the output of the integrating servo-loop amplifier and an input to the output buffer stage.

Figure 4:
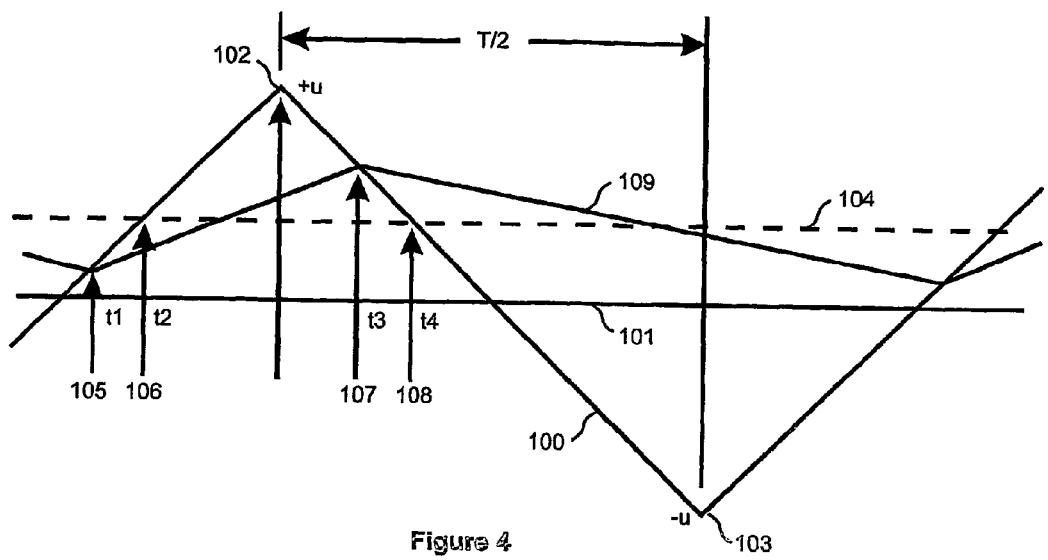
FIG. 4 shows waveforms of a triangular-wave carrier reference signal and servo-loop amplifier output for a D.C. input signal.

The reason for including this variable time period advance element may be most easily visualised in FIG. 4. This shows both the output of a servo-loop amplifier 109 and the triangular-wave carrier reference signal 100 for a D.C. input signal. These signals may arise from prior art class-D circuit such as that shown in FIG. 5. In order to simplify analysis, the output 111 of this circuit switches between +/−u volts and the peaks of the triangular-wave at the output of the oscillator 112 are also +/−u volts.

Figure 5:
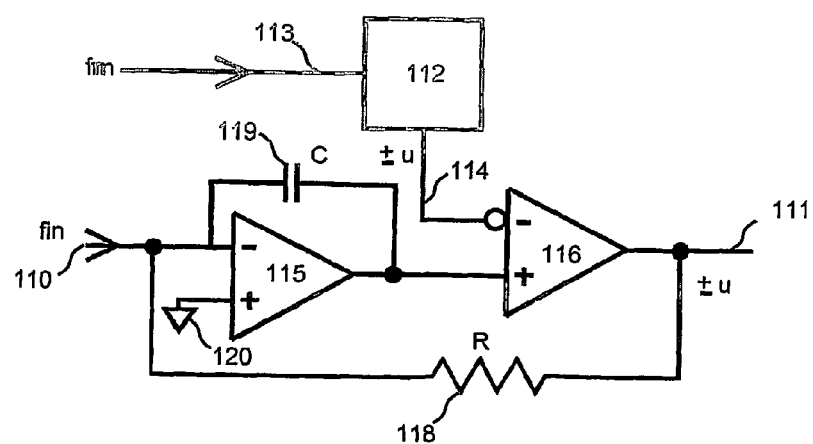
FIG. 5 shows a circuit containing the basic elements for a class-D amplifier including a carrier reference signal modulation input according to the invention.

The triangular-wave oscillator 112 has an output 114 connected to an inverting input of a comparator plus output switching stage 116. The triangular-wave signal at 114 has a fundamental period of T. The output 111 of the comparator plus output switching stage 116 is the output of the class-D amplifier. The input 110 of the class-D amplifier in FIG. 5 is a current signal. This feeds an inverting input of the class-D amplifier, which is the inverting input of a servo-loop operational amplifier 115. The non-inverting input of the servo-loop operational amplifier 115 is referenced to ground 120. A capacitor 119 of value C is connected between the output 117 of the servo-loop operational amplifier 115 and its inverting input. The output 117 is connected to a non-inverting input of the comparator and switching stage 116. A resistor 118 of value R is connected between the output 111 of the comparator plus output switching stage 116 and the inverting input of the servo-loop amplifier 115. This forms a negative feedback path from the output to the input of the class-D amplifier. In this circuit, the servo-loop amplifier is connected as an integrator. The combination of 115 and 119 may be thought of as the servo-loop amplifier.

A D.C. input signal at 110 results in the signals shown in FIG. 4. This D.C. input signal is a D.C. current of value –i and causes a mean offset 104 of value x volts at the output 117 of the servo-loop amplifier 115, about which the output signal 109 of the servo-loop operational amplifier 115 oscillates. (The reference to $f_{in}$ and $f_m$ refer to a later description.) The output signal 109 of the servo-loop amplifier has a positive slope of (i+u/R)/C volts/second when the output 111 is –u volts, and a negative slope (i–u/R)/C when the output 111 is +u volts. The triangular-wave carrier reference signal 100 peaks at +u at 102 and –u at 103 and is symmetric about 0V 101. This signal appears at the output 114 of the triangular-wave oscillator 112. Switching transitions at 111 occur when the output voltage 109 of the servo-loop amplifier equals the triangular-wave voltage 100, namely at 105 at time t1, and 107 at time t3. The advance period results from the asymmetry of t1 and t3 relative to the peak of the triangular-wave 102. The symmetric times would be at 106, t2, and 108, t4, for the same duty cycle. If 104 is increased to the limit just below +u, at 102, then the advanced period is 0 seconds.

The advance period=$t2-t-1=t4-t3=T(1-(x/u)^2)/(16RC)$  (i).

This non-linear advance function is the main cause of the intrinsic distortion.

To simplify the below analysis, assume that the input signal is a sine-wave of amplitude v and frequency $f_{in}$ and is approximately in phase with, and proportional to, the mean signal at the output of the servo-loop amplifier (this is only approximate at higher frequencies). The non-linear function (i) behaviour results in several features of this system:

1. The distortion relative to the output signal level is approximately proportional to $(vf_{in})^2$: The $v^2$ resulting from the square in equation (i) and the $f_{in}^2$ resulting from a factor of $f_{in}$ from the percentage of phase advance being proportional to frequency $f_{in}$, and another factor of f resulting from the feedback factor which is proportional to the open loop forward gain, decreasing as 1/frequency owing to the forward gain of the integrator.
2. Owing to symmetry, the idealised harmonic distortion is odd only, mostly the third harmonic, owing to the relatively smooth non-linear transfer function (i). Symmetry also makes the phase of the third harmonic in quadrature, relative to the fundamental of the sinusoidal input signal, when measured at the output of the output switching stage. The sign of this third harmonic is consistent with the fundamental sine-wave appearing to be delayed slightly near the peaks.
3. The output of the servo-loop amplifier is intrinsically asymmetric relative to the peak of the fundamental, even if the fundamental frequency $f_{in}$ at the output of the servo-loop is notched out.

I have discovered that it is possible to modulate the slopes of the triangular-wave carrier reference signal in proportion to the derivative of the input signal. The negation of distortion is most successful if this derivative signal is shifted in phase and gain to compensate for the closed loop phase and gain of the amplifier. An example of modulation is a positive slope increasing and the next negative slope becoming less negative, such that the frequency remains approximately constant.

I will highlight various features of the slope-modulated carrier reference system compared to the prior art unmodulated system, in order to aid understanding of the reasons for the cancellation of distortion produced in the modulated system compared to the intrinsically distorted unmodulated system. It is easiest to consider a sinusoidal input which, when amplified, produces an output on the verge of clipping. Under these circumstances, when the amplitude of the output signal is very near its peaks, the duty cycle of the switched output is near to 0% near one peak, and near 100% for the oppositely signed peak, and the slope modulation is approximately zero. Hence, the modulated and unmodulated waveforms at the output of these peaks are similar. Consider the peaks of both the triangular wave and sinusoidal wave to be to be reference points for both the modulated and unmodulated systems, that is, in both systems consider the output signals at 111 and 114 to be coincident at the peaks for the sake of understanding. Assume that the output amplitudes and mean carrier frequencies for both the modulated and unmodulated systems are adjusted to be identical. If the degree of slope modulation is m:

a. During the time when the switched output is in the vicinity of its peaks, as stated the modulation m is about zero, but dm/dt is near its peak values, which causes the triangular-wave to appear as an increased carrier reference frequency relatively to the servo-loop output signal, which is also near its peak value. Thus in the modulated system, the output switching transitions about the peaks are shifted closer to the peaks compared to the unmodulated system. Owing to symmetry, when the mean of the output signal of the servo-loop passes through 0 volts, the switching transitions occur at about the same time for both the modulated and unmodulated systems.

b. The modulation causes the output signal of the servo-loop amplifier to be, on average, advanced relative to the unmodulated system, except at the peaks. This advance is most accentuated between zero and an approaching peak owing to a progressively accumulating effect.

This Is consistent with point 2 above. From the point of view of the variations of the non-linear effects, the fact that the triangular-wave carrier reference signal is being modulated results in an intrinsic cancellation of the non-linearities.

Figure 6:
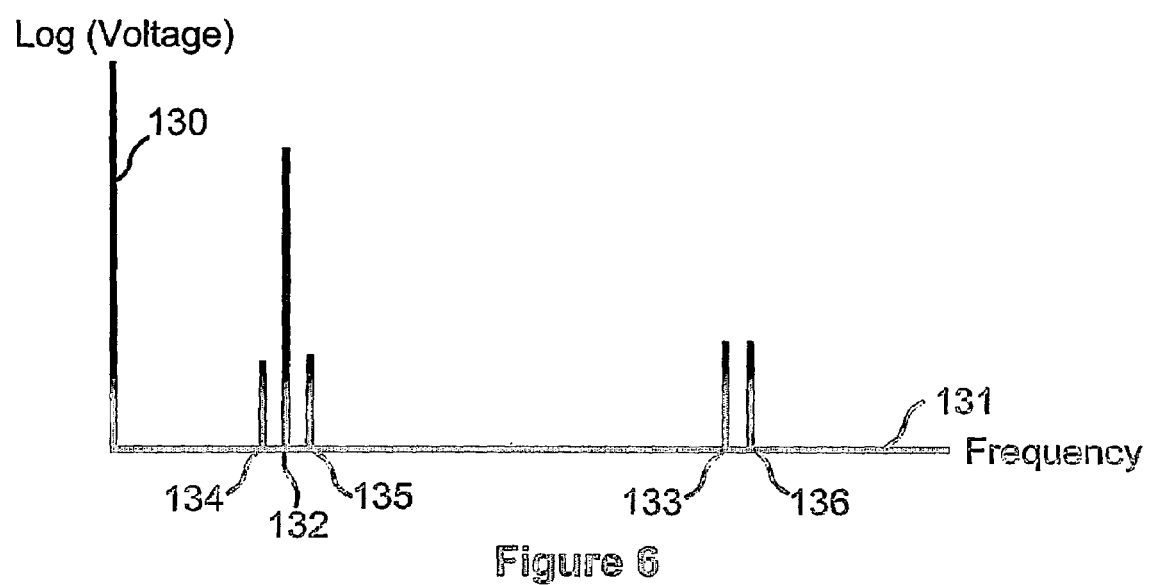
FIG. 6 is a frequency spectrum at the class-D output for a sine-wave input signal of frequency $f_{in}$ and a triangular-wave carrier reference signal that is slope-modulated by another sine-wave signal of frequency $f_m$.

To further illustrate the effects of the modulation of the carrier reference signal, reference is made to FIG. 6, a graph of the amplitude frequency spectrum of the output signal of the modulated system. The vertical axis is of amplitude and has a logarithmic scale, while the horizontal axis is of frequency and has a linear scale. The spectrum shown is for the output of the modulated system with input signal of a sinusoidal wave of frequency $f_{in}$, with a sinusoidal signal of frequency $f_m$ and amplitude m being fed to a modulation input 113 of the triangular wave oscillator. The amplitude of a third harmonic of $f_{in}$ is shown by the column 133, of frequency $3f_{in}$. The amplitude of the modulation signal of frequency $f_m$ is shown by the column 135. The amplitude of a sideband of frequency $f_{in}-(f_m-f_{in})$ is shown by the column 134. The amplitude of another sideband of frequency $3f_{in}-(f_m-f_{in})$ is shown by the column 136, its amplitude being approximately proportional to $m(f_{in}v)^2$.

Thus, if the frequencies $f_m=f_{in}$ and amplitudes m=kv, for a selected value of k and relative phase between $f_{in}$ and $f_m$, the signals represented by the columns 133 and 136 may cancel. The selected phase occurs when $f_{in}$ is approximately in quadrature with $f_m$. In fact, for optimal cancellation, the relative phases should also compensate for the closed loop phase of the amplifier.

Figure 1:
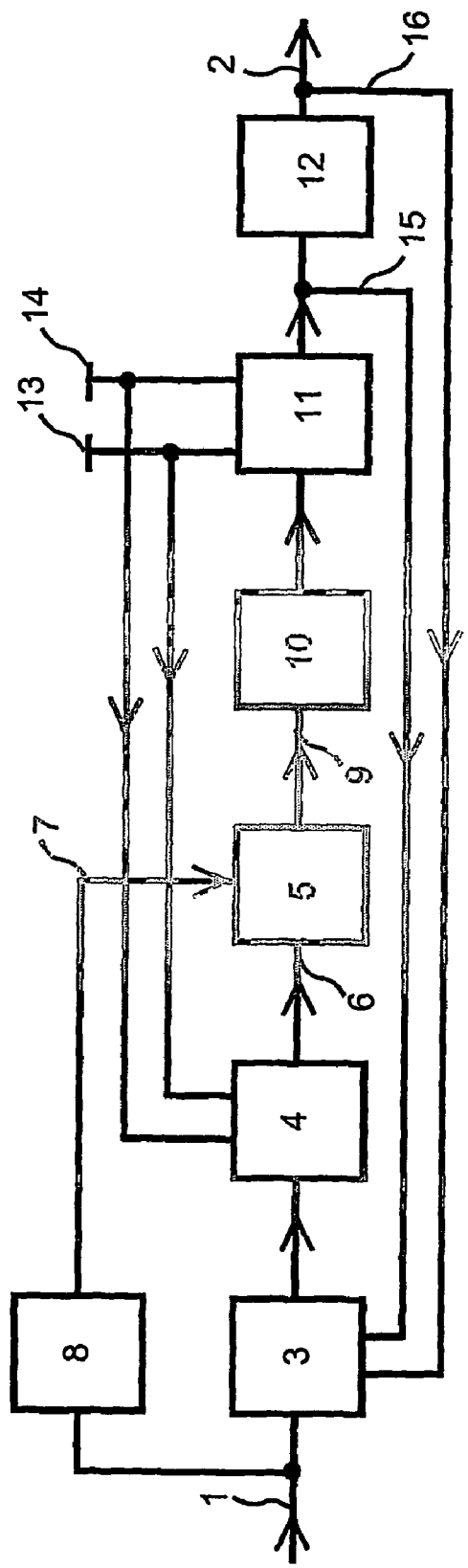
FIG. 1 is a functional block diagram of the invention.

In FIG. 1, which shows a block diagram of an example of an electronic class-D amplifier utilising this invention, an amplifier input 1 feeds an input of a servo-loop amplifier 3 and an Input of an input signal processor 4. An output signal of an oscillator 5 produces a carrier reference signal at 13. The carrier reference signal contains at least finite positive and negative time derivative components; for example, the positive and negative slopes of a triangular wave. An output signal of the input signal processor 4 is applied to a modulation input of the oscillator 5. The positive and negative time derivative components are modulated by the said output of 4, whereby at least the symmetry of the carrier reference signal is modulated. This modulation may include frequency modulation of the carrier reference signal to some extent. The carrier reference signal at 13 is connected to an input of a first comparator circuit 6. The output of the servo-loop amplifier 3 also feeds an input of a first comparator 6. The combination of the oscillator 5 and first comparator 6 functionally form a pulse width modulator. The output of the comparator 6 which acts as an output of the pulse width modulator controls drivers 7 which in turn control output switches 8. Output switches 8 are supplied by power supply rails 9 and 10. An output 11 of the output switching stage is fed back via a negative feedback path to an input of the servo-loop amplifier 3. In order to reduce gain modulation of the amplifier by the power supply rails, the output amplitude of the carrier reference signal of the oscillator is controlled to be in proportion to the difference in potential between power supply rails 9 and 10. The output 11 of the output switching stage may be connected to a carrier frequency plus harmonic filter, sometimes called a demodulation filter 12. An output of this filter is connected the amplifier output 2. The combination of the drivers 7 and output switches 8 functionally forms an output switching stage, which may also include 12 within this definition. In a further embodiment, a further negative feedback path may be connected between the amplifier output 2 and an input to the servo-loop amplifier 3.

Beside the function of the input signal processor and oscillator modulation feature, this system is the same as the common type described above. However, the oscillator modulation feature substantially improves accuracy as described below.

Certain types of modulation of the symmetry of the carrier reference signal will result in improved accuracy of the amplifier. For example, the forward transfer function of the input signal processor, which includes at least a derivative with respect to time, is suitable for modulation of the symmetry of the oscillator carrier reference signal and, to some extent, modulation of the frequency of the oscillator carrier reference signal as well. Modulation directly proportional to the output of the input signal time differential for a particular modulation gain and given gains in the rest of the system may result in intrinsically near-zero distortion; that is, mathematically near-zero distortion when assuming that ideal electronic components are in the system.

However in practice, the potentially low distortion intrinsic to such a system is reduced by electronic imperfections which are typically most acute in output switching stages which, in audio power amplifiers, often produce transient peak currents of many tens of amperes and produce cross-over distortion resulting from switching dead-times.

One way of significantly reducing the effects of electronic imperfections is to increase the amount of negative feedback by a higher order servo-loop (that is, greater than the first order of the common system). However, this feature actually intrinsically adds more distortion at higher frequencies, as stated above. In order to negate this, forward transfer functions of integrating elements in both the oscillator and servo-loop amplifier are required to be at least second order. These are selected so that the carrier reference signal compensates for the transfer function of the servo-loop amplifier. This then makes it possible to intrinsically reduce that distortion, due to imperfections in the electronics, to near zero levels using modulation of the carrier reference signal.

With the mean frequency of the output carrier reference signal and the peak signal from the output of the output switching stage and potential currents flowing within this stage all consistent with class-D audio power amplification, it is possible to produce an audio power amplifier, using these techniques, with similar performances to common well designed class-A, -B, or -AB analogue amplifiers.

Figure 2:
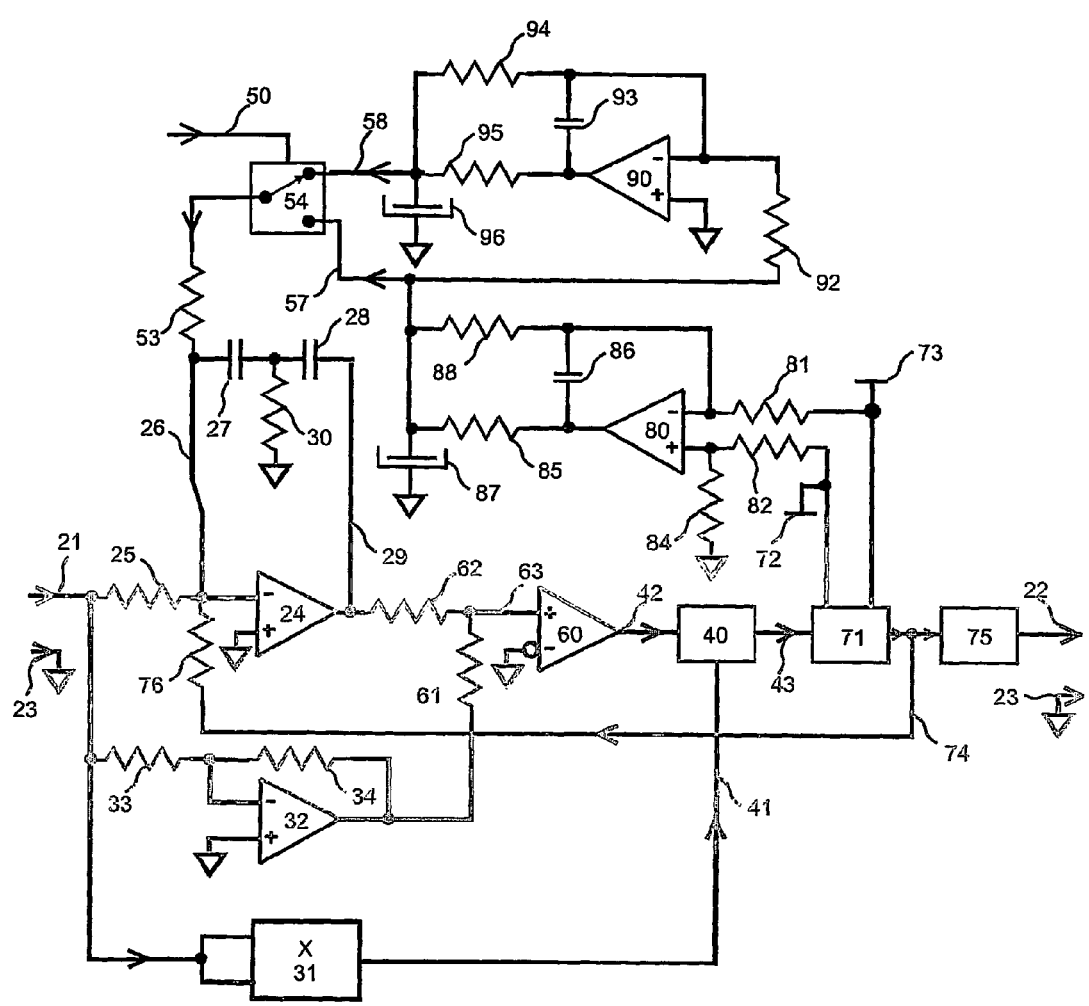
FIG. 2 is an exemplary circuit of the system of the invention.

FIG. 2 gives an example of such a system. The amplifier input signal is applied to the amplifier input 21 and an output signal is available at the amplifier output 22. The amplifier earth is at rail 23. The amplifier input 21, via resistor 25, is connected to a servo-loop amplifier consisting of a resistor 30, capacitors 27 and 28, and an operational amplifier 24. These same components form the servo-loop amplifier integrating element and these are configured to produce a second order forward transfer function, that is, the ratio between the input signal at 21 and output signal at 29 is $$-[1+R30(C27+C28)s]/(R25R30C27C28\ s^2) \qquad \text{(ii)}$$

where s is the Laplace variable (="−jw" for sinusoidal cw).

If C27=C28 in value, then the transition from 6 dB/octave to 12 dB/octave occurs when $$s=2/(R25C27).$$

The amplifier input 21 is also connected to an input signal processor, in this example a non-inverting differentiator consisting of resistors 32, 35, 37, and 39, capacitors 31 and 36, and operational amplifiers 33 and 38. The first of these operational amplifiers 33 is wired up as a common inverting differentiator, but with high frequency (audio) phase and gain compensation (R35 C36, and R32 C31) to approximately compensate the (audio) high frequency forward closed loop transfer function between the amplifier input 21 and output of an output switching stage 70 and 71. Ignoring this low relatively small phase compensation, the transfer function of this inverting differentiator is approximately $$-R35C31s. \qquad \text{(iii)}$$

The output of this inverting differentiator is inverted by the inverter consisting of resistors 37 and 39 and operational amplifier 38. The non-inverted output 40 of the differentiator, which is the output of the input signal processor, is fed to the modulation input of an oscillator consisting of resistors 42, 45, 51, 53 and 56, and capacitors 43 and 44 (and 87 and 96), and operational amplifier 41, and a second comparator 50, and an analogue switch 54. The "integrating element" of the oscillator consists of resistors 42, 45 and 56, and capacitors 43 and 44 and operational amplifier 41; it is also configured to produce a second order forward transfer function. It is simplest to consider this from two independent points of view.

First, if the output 40 is held at 0V, then the forward transfer ratio between the output 46 of the "integrating element" with respect the input at 55 has the same form as that of the servo-loop amplifier, namely equation (ii)

$$-[1+R45(C43+C44)s]/(R56R45C43C44s^2) \qquad (iv)$$

Second, if the signal at 55 were constrained to be 0V, then the forward transfer ratio between the output 46 of the "integrating element" with respect the input at 40 is $$-[1+\{R45(C43+C44)+(R42C44)\}s]/(R42R45C43C44s^2) \qquad (v)$$

With respect to the amplifier input signal the forward transfer at 46 with 55 constrained to 0V is $$-R35C31R39/(R37R42R45C43C44s)-R39R35C31\\ [R45(C43+C44)+R42C44]/\\ (R37R42R45C43C44) \qquad (vi).$$

(Again the effects of the phase compensation of R32 C31 and R35 C36 is not taken into account.)

The output 46 is fed to an input 52 of the second comparator 50 via resistor 51. The output of the second comparator 50 controls an analogue switch 54 which switches between the voltages at 58 and 57. The output 55 of the switch 54 also feeds input 52 of the second comparator 50 via resistor 53 as a positive feedbacks path and the input of the "integrating element" via resistor 56 as a negative feedback path. The output 55 of the switch 54 emits a signal that is a near-square wave whose duty cycle is modulated by the differential of the amplifier input signal and whose frequency is slightly modulated as well. The oscillator output 46 emits the carrier reference signal which is a near triangular wave but with non-zero slope time derivatives of all orders owing to the second order forward transfer function of the integrating element of the oscillator. In other words, the slopes of the triangular wave are slightly "bent" according to exponential functions. In addition, the positive and negative slopes, or positive and negative time derivatives, as well as the frequency of the carrier reference signal, are modulated by the differential of the amplifier input signal to a small extent. This feature compensates the intrinsic distortion of the amplifier for particular choices of transfer functions and various parameters of the various circuit elements. Such transfer functions are, for example: the forward gain of the output switching stage, the forward gain of the servo-loop amplifier, and modulation forward gain of the oscillator and differentiator, the mean frequency of the carrier reference output signal, and the gain of the amplifier.

The output 46 of the oscillator is fed to an input of a first comparator 60 via resistor 61, as is the output 29 of the servo-loop amplifier via resistor 62. The combination of the oscillator (made up of components 41, 42, 43, 44, 45, 46, 50, 51, 52, 53, 54, 55, 56 and the power supply rail tracking system) and the comparator (made up of components 60, 61, 62, 63) acts as a pulse width modulator with the output of the first comparator 60 acting as the output of the pulse width modulator, and the input being at 29. The output of the first comparator controls drivers 70 of output switches 71. Power is supplied to the output switches by power supply rails 72 and 73. An output 74 of the output switches 71 is fed back to an input of the servo-loop amplifier as a negative feedback path via resistor 76. The output 74 of output switches 71 is also fed to a filter which attenuates the carrier frequency plus harmonics which is sometimes called a demodulation filter 75. An output of the demodulation filter is the output 22 of the amplifier. The switch drivers 70 and the output switches 71 may be said to form an output switching stage, and the demodulation filter 75 may be considered as included within the definition of the output switching stage.

The difference in potential between the power supply rails 72 and 73 is measured by a difference amplifier consisting of operational amplifier 80, resistors 81, 82, 85, and 88, and capacitors 86 and 87. The output 57 of this difference amplifier is low impedance at all frequencies owing to the action of the capacitors and local negative feedback. Capacitor 86 is necessary to form a local dominant pole for stability purposes. The signal at 57 is inverted by an inverting amplifier consisting of resistors 92, 94 and 95, and capacitors 93 and 96, and operational amplifier 90. The output 58 of this inverter is also low impedance at all frequencies. Thus 57 and 58 track the mean difference in power supply rail voltage between 72 and 73 which in turn causes the output peaks of the oscillator carrier reference signal to track a difference in potential between power supply rails which supply the output switching stage. This feature compensates for power supply variation and modulation.

It should be noted that there are many different ways to implement the above equations, In particular (ii), (iv) and (vi), and hence FIG. 2 is merely an example of one such way. Furthermore, a triangular wave is merely an example of a carrier reference signal; another, for example, is the carrier reference signal described above using a second order loop Integrating element.

Another way of implementing equations (ii), (iv) and (vi) Is by excluding the inverting stage of the differentiator, consisting of resistors 37 and 39 and operational amplifier 38, so that the input signal processor is an inverting differentiator. Such as system will also produce intrinsically low distortion, but with different values for the differentiator gain and time constant of the second order integrating element of oscillator, namely R45(C43+C44), compared to the non-inverting differentiator system described above.

Owing to the relatively high frequency of typical carrier reference signals (>=500 kHz), which no doubt will increase as electronic components improve in future years, it is beneficial for accuracy of the carrier signal, and hence whole amplifier, to utilise a wideband operational amplifier within the integrating elements owing to the relatively high gains of such devices at the carrier reference signal frequency and its harmonics. For example, a wideband amplifier with a unity-gain-bandwidth of more than 100 MHz is useful.

Figure 3:
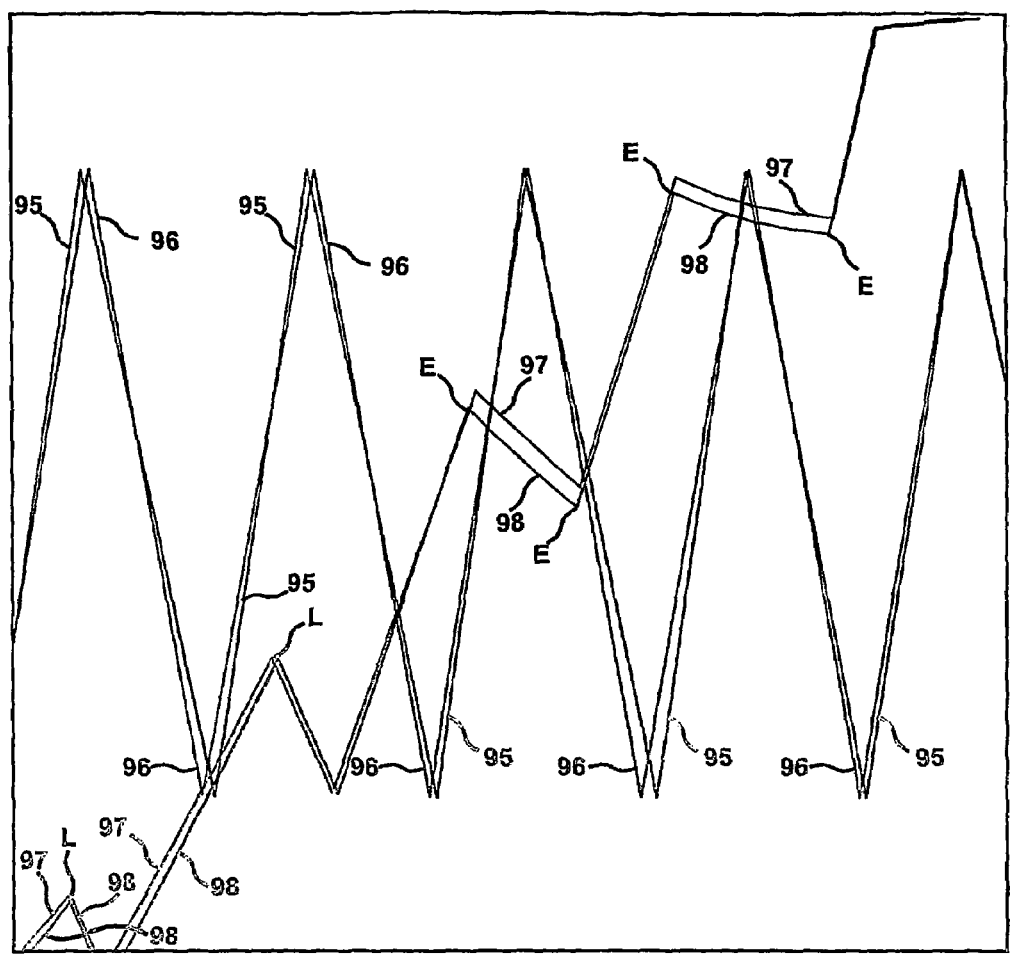
FIG. 3 shows an example of waveforms of the system of the invention in comparison to those of a conventional prior art second order servo-loop system.

FIG. 3 illustrates an example of the difference between the unmodulated carrier reference system and modulated for the system described herein. Here the signals were set up as described in the above description which compared the modulated to the unmodulated system. In this figure the input signal is set at a relatively high frequency (approx 35 kHz) relative to the carrier reference signal (approx 500 kHz) and also at near overload levels so as to enhance the differences. The carrier reference waveform for the second order modulated system disclosed herein is shown as waveform 95 and the unmodulated system as waveform 96. The output of the servo-loop amplifier (29 in FIG. 2) for the unmodulated system is given as waveform 98, while the modulated system disclosed herein is shown by waveform 97. As can be seen, the output stage switching times, which correspond to derivative discontinuities of the servo-loop waveforms, occur at different times for the modulation system (95, 97) and unmodulated system (96, 98). The local peaks, which correspond to switching times, are indicated for the unmodulated system by either an "L" if this time is later than the modulated system, or an "E" if earlier. If the time difference is negligible, no indication is given. In this example, the switching times of the unmodulated system are relatively late initially, and then become early. This occurs at the time approximately when the servo-loop signal passes through zero volts as described earlier.

Throughout this specification the purpose of the description has been to illustrate the invention and not to limit this.

The invention claimed is:

1. An electronic class-D amplifier including:
   an amplifier input to which an amplifier input signal may be applied,
   an amplifier output which may produce an amplifier output signal,
   an output switching stage,
   a pulse width modulator which includes an oscillator and a first comparator,
   at least one servo-loop amplifier,
   an input signal processor which processes and modifies the input amplifier signal,
   wherein an output signal of the oscillator produces a carrier reference signal which includes at least positive and negative time derivative components,
   which are modulated by an output of the input signal processor which is applied to a modulation input of the oscillator,
   whereby at least the symmetry of the carrier reference signal is modulated,
   and the oscillator includes at least one integrating element,
   the amplifier input being connected to an input of the servo-loop amplifier, the servo-loop amplifier also including at least one integrating element,
   the amplifier input also being connected to a modulation input of the input signal processor,
   an output of the servo-loop amplifier being connected to an input of the pulse width modulator,
   an output of the pulse width modulator being connected to an input of the output switching stage,
   and an output of the output switching stage being connected to the amplifier output,
   wherein a negative feedback path connects an output of the output switching stage to an input of the servo-loop amplifier.

2. An electronic class-D amplifier as in claim 1, wherein a forward transfer function of the integrating element of the oscillator is at least second order,
   and the forward transfer function of the integrating element of the servo-loop amplifier is at least second order.

3. An electronic class-D amplifier as in claim 1, wherein the input signal processor includes a forward transfer function which includes at least a derivative with respect to time.

4. An electronic class-D amplifier as in claim 1, further including power supply rails which supply the output switching stage, wherein peaks of the carrier reference signal track a difference in potential between the said supply rails which supply the output switching stage.

5. An electronic class-D amplifier as in claim 1 wherein an output of the servo- loop amplifier is connected to an input of the said first comparator, the carrier reference output signal of the oscillator is connected to an input of the comparator, and an output of the comparator is an output of the pulse width modulator.

6. An electronic class-D amplifier as in claim 1 wherein the forward gain of the output switching stage, the forward gain of the servo-loop amplifier, and modulation forward gain of the oscillator and input signal processor, and the carrier reference output signal's mean frequency, and the gain of the negative feedback path, are selected to lower the distortion of a signal at the amplifier output relative to a signal applied to the amplifier input.

7. An electronic class-D amplifier as in claim 1 wherein the oscillator includes and wide-band amplifier with a unity-gain-bandwidth of at least greater than 100 MHz.

8. An electronic class-D amplifier as in claim 1 wherein the mean output carrier reference signal frequency, and the peak signal from the output of the output switching stage and potential currents flowing within this stage, are consistent with class-D power audio amplification.

* * * * *